United States Patent [19]

Wilcox

[11] Patent Number: 4,775,843
[45] Date of Patent: Oct. 4, 1988

[54] WIDEBAND POST AMPLIFIER FOR PRODUCT DETECTOR

[75] Inventor: Milton E. Wilcox, Saratoga, Calif.

[73] Assignee: National Semiconductor Corporation, Santa Clara, Calif.

[21] Appl. No.: 50,364

[22] Filed: May 18, 1987

[51] Int. Cl.$^4$ .............................................. H03F 3/45
[52] U.S. Cl. .................................... 330/260; 330/293
[58] Field of Search .............. 330/147, 260, 261, 275, 330/293, 301; 455/341; 329/192; 358/184

[56] References Cited

U.S. PATENT DOCUMENTS 3,908,171  9/1975  Wilcox ................................. 330/252
4,275,419  6/1981  Wilcox ............................. 358/184 X Primary Examiner—James B. Mullins
Attorney, Agent, or Firm—Lee Patch; Gail W. Woodward; Mark Aker

[57] ABSTRACT

A wide bandwidth amplifier is coupled to the differential output of a four-quadrant multiplier. The amplifier includes a differential to single-ended input stage driving the inverting input of an operational amplifier which has its noninverting input operating at a reference potential level. The amplifier output is coupled by way of a level shifting means to the circuit output terminal which is thereby referenced to ground potential. The circuit output terminal is returned through a resistor to a source of opposite polarity power supply so that the output terminal can swing above and below ground. The second supply is only connected by way of the output terminal so that it does not require an extra package pin.

7 Claims, 2 Drawing Sheets

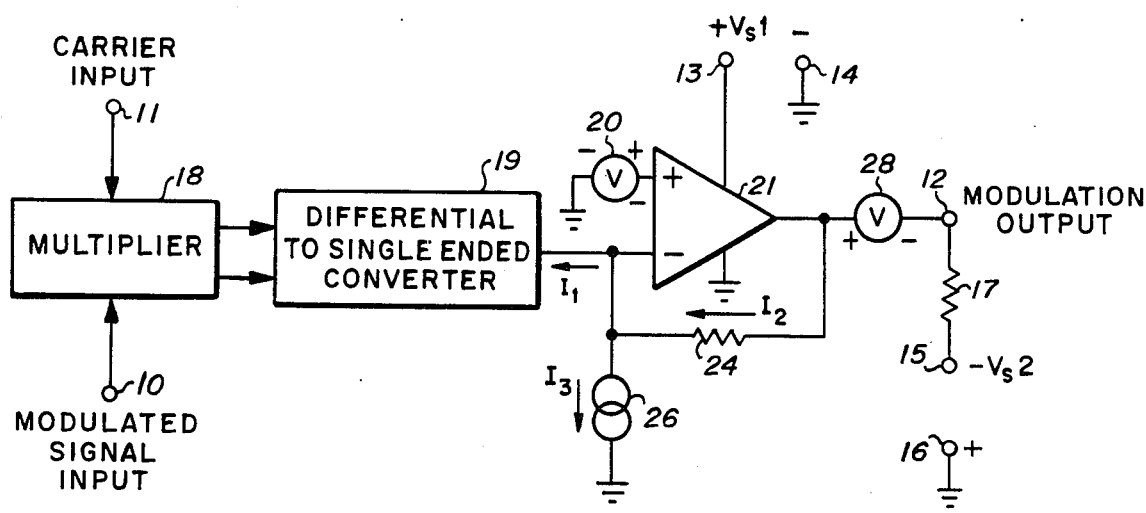
Fig_1

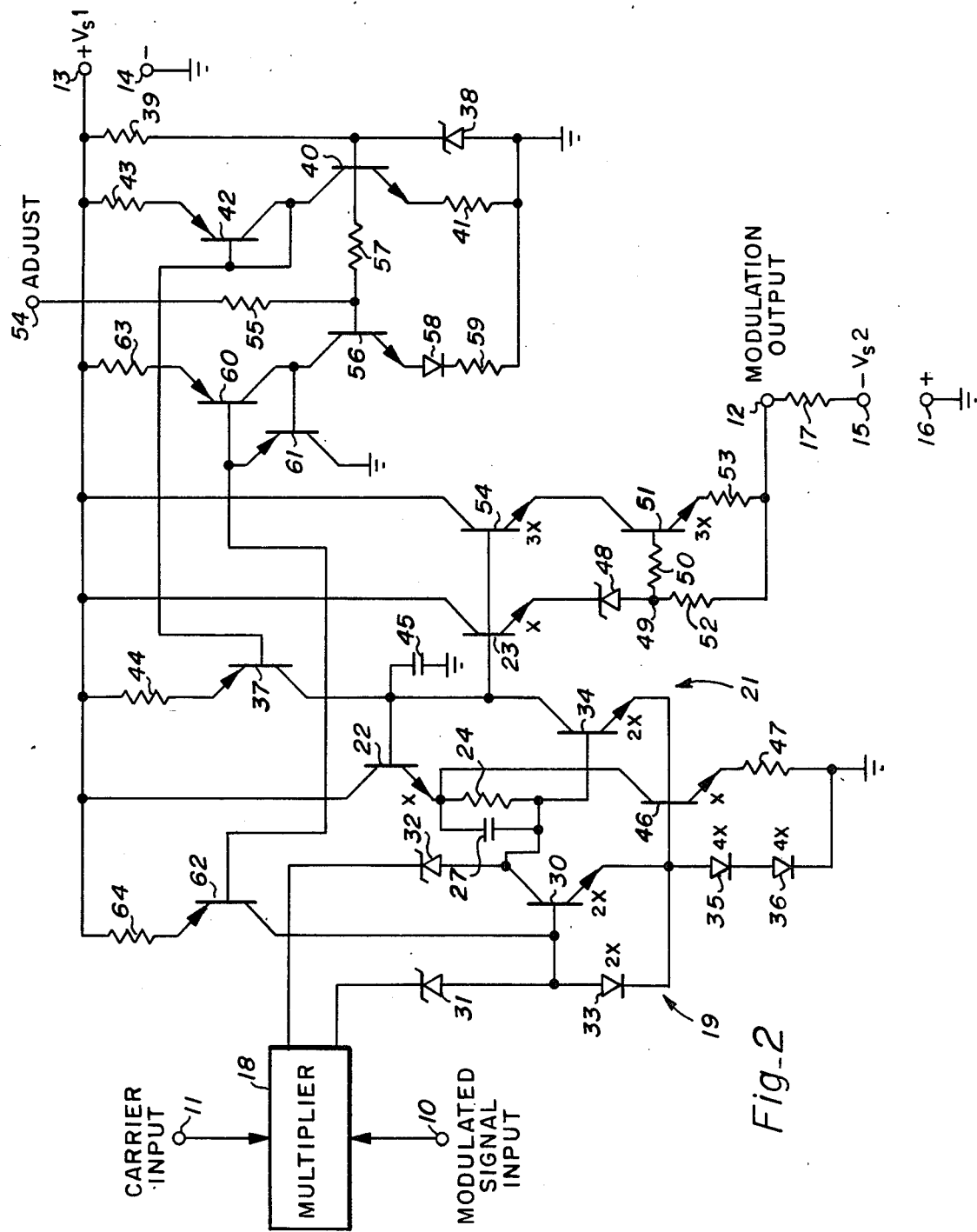
Fig_2

WIDEBAND POST AMPLIFIER FOR PRODUCT DETECTOR

BACKGROUND OF THE INVENTION

The invention relates to a post amplifier that receives the differential output of a product detector and provides a single-ended output that is referenced to ground. That is the output swings above and below ground in response to the modulation on the modulated carrier signal, but for quiescent conditions is at ground potential. Product detectors are well-known in the form of synchronous detectors for responding to amplitude modulated signals and as phase or frequency detectors well-known in the FM receiver art My U.S. Pat. No. 3,908,171 issued Sept. 23, 1975, and is titled "AMPLIFIER CIRCUIT SUITABLE FOR AMPLIFYING DIFFERENTIAL INPUT SIGNALS AN PROVIDING A SINGLE ENDED OUTPUT SIGNAL". The title of this patent describes the circuit. My U.S. Pat. No. 4,275,419 issued June 23, 1981, and is titled "VIDEO AMPLIFIER WITH NOISE INVERSION". This patent relates to a synchronous video detector with a noise-cancelling post-detection amplifier. The teaching in these two patents is incorporated herein by reference.

SUMMARY OF THE INVENTION

It is an object of the invention to provide an IC wideband amplifier for receiving a differential signal from a product detector and for producing a single-ended output referenced to ground.

It is a further object of the invention to amplify the differential output of a product detector and to supply a single-ended output related to the input signal modulation and referenced to ground so that the demodulated signal output swings above and below ground.

These and other objects are achieved in a circuit configured as follows. A multiplier is provided with a modulated signal input and a carrier signal input. The differential output is directly coupled to a differential to single-ended converter that drives the inverting input of a differential operational amplifier (op amp). The op amp is powered from a conventionally connected first power supply and the noninverting input is provided with a d-c reference. A feedback resistor couples the output back to the op amp inverting input whereby the inverting input will be clamped at the reference potential and responsive to current drive. The op amp output is also coupled to the circuit output terminal. A level shift potential producing element is coupled in series with the op amp output so that the output terminal is operated at ground potential. This level shift is related to the voltage drop across the above-described feedback resistor. A negative second power supply is coupled through a resistor to the output terminal to sink the current flowing in the output stage thereby to place the output terminal at ground. Therefore, as the multiplier output swings up and down, the op amp inverting input will swing above and below the reference potential. Thus, the output terminal will swing above and below ground. Since the second power supply is only coupled to the output terminal it does not require a separate IC pin.

DESCRIPTION OF THE DRAWING

FIG. 1 is block-schematic diagram showing the essential elements of the invention.

FIG. 2 is a more detailed schematic diagram of the circuit of the invention.

DESCRIPTION OF THE INVENTION

In the following discussion IC elements of the kind employed in conventional junction isolated monolithic silicon devices are portrayed. Since the transistors involved all have relatively high base to collector current gain values, the base currents will be ignored in the following discussion. Such a simplification will be accurate to a first order and makes the circuit operation much more understandable. Since all of the transistors in the signal amplifying portions of the circuit are NPN type the circuit operation is wideband.

FIG. 1 is a simplified schematic-block diagram of the circuit of the invention. The basic circuit receives a modulated signal input at terminal 10 and a carrier signal input at terminal 11. It produces a replica of the carrier modulation at output terminal 12. Desirably, the output terminal 12 is referenced to ground and can swing above and below ground as dictated by the carrier modulation. The circuit operates from a power supply, $V_S1$, connected $+$ to terminal 13 and $-$ to ground terminal 14. To account for negative output signals a second power supply, $V_S2$, is connected $-$ to terminal 15 and $+$ to ground terminal 16. As a practical matter the second power supply $V_S2$ is only connected to output terminal 12 by way of resistor 17. This means that, while two supplies are involved, only one IC power supply terminal is needed in addition to ground.

At the input, terminals 10 and 11 both feed a multiplier 18 which acts as a detector. Where amplitude modulated signals are involved, the carrier and modulation signals are either zero or 180 degrees apart and the multiplication produces synchronous detection. For FM (or PM) detection the two signals are either 90 or 270 degrees apart and the multiplier provides phase detection. Multiplier 18 has two outputs as shown by the two arrows. Typically, the upper output is related to $I_0-I_S/2$ where $I_0$ is a nominal bias current and $I_S$ is the modulation signal component. The other or lower output would be related to $I_0+I_S/2$. Thus, a differential signal is involved.

The detector is followed by a differential to single-ended converter 19 which produces a modulation signal related out put current $I_1$. This differential to single-ended converter subtractively combines the two multiplier output currents. Thus, $I_0+I_S/2-(I_0-I_S/2)=I_S$ which represents the current $I_1$.

Op amp 21 has its inverting input driven by $I_1$ and its noninverting input is held at a constant bias by voltage source 20. The output of op amp 21 is coupled to its inverting input by resistor 24 which completes a negative feedback loop. Current sink 26 is coupled from the inverting input to ground. For quiescent signal conditions, when $I_1$ is zero, $I_2$ flowing in resistor 24 is equal to $I_3$ flowing in current sink 26. For this condition the output of op amp 21 will rise until the inverting input is pulled up to the level of voltage source 20. In effect, the inverting input is clamped at the potential of the noninverting input and will respond to input current $I_1$. The output of op amp 21 is coupled to output terminal 12 by way of constant voltage source 28 which has a value that will produce zero volts at terminal 12 for quiescent conditions. Thus, when $I_2$ equals $I_3$ and the op amp 21 differential input is zero the level shift voltage 28 will equal the output of op amp 21.

As $I_1$ rises, $I_2$ must rise so that $I_2=I_1+I_3$ and the output of op amp 21 will rise. This means that terminal 12 will be positive. When $I_1$ reverses, $I_2$ will fall and the output of op amp 21 will fall below the quiescent level. Thus, terminal 12 will go negative. For this condition supply $V_{S2}$ will pull terminal 12 below ground by sinking current through resistor 17.

FIG. 2 is a more detailed schematic diagram of the circuit of the invention. Where similar parts are involved the FIG. 1 reference numerals will be used. Multiplier 18 will preferably be a well-known cross-coupled variable-transconductance circuit A differential signal coupled to terminal 10 will be linearly multiplied by the differential signal at terminal 11.

The differential output of multiplier 18 is level shifted by zener diodes 31 and 32 and applied differentially to transistor 30. Diode 33, which has an area matched to that of transistor 30, converts transistor 30 to a unity-gain current amplifier (or unity gain current mirror). The collector of transistor 30 is directly coupled to the base of transistor 34 which represents the inverting input of op amp 21. The emitter of transistor 34 is returned to the emitter of transistor 30 and the combination returned to ground through series connected diodes 35 and 36. As shown on the schematic, transistor 34 has an area that matches transistor 30 and diode 33. Diodes 35 and 36 have an area double that of transistor 34. Thus, the emitter of transistor 34 is referenced at two diodes above ground. The action of the op amp inverting input is balanced by the noninverting emitter input which will effectively be referenced at the transistor base at three diodes above around (about 2.1 volts at 300° K).

Transistor 34, which is the high gain element of op amp 21, is operated by transistor 37 at a current that will provide a very high voltage gain that is relatively constant. Capacitor 45 which shunts the collector of transistor 34 frequency compensates op amp 21. The signal at the collector of transistor 34 is fed back via emitter follower 22 and resistor 24 to the base of transistor 34. This negative feedback stabilizes op amp 21 as was described in FIG. 1. Capacitor 27 frequency compensates the negative feedback loop.

The conduction of transistor 37 is determined as follows. Zener diode 38 is biased into reverse breakdown by the current flowing in resistor 39. This current is established to force the desired conduction which is typically about one milli-ampere, and which establishes the zener voltage across diode 38. The zener voltage is applied to the base of transistor 40 in which the conduction is determined by the value of resistor 41. The collector current in transistor 40 flows in diode connected transistor 42 and resistor 43. Diode connected transistor 42 forms a current mirror with transistor 37. Thus, the current flowing in transistor 37, and transistor 34 is a replica of the current flowing in zener diode 38.

The voltage at the base of transistor 34 will be equal to its collector voltage less the voltage drop across resistor 24 and the $V_{BE}$ of transistor 22. Since the collector of transistor 34 constitutes the effective output of op amp 21 this voltage drop represents the voltage shift between the inverting input and output of the op amp. The total current flowing in transistor 22 is the sum of the currents flowing in resistor 24 and current sink transistor 46 which is biased by resistor 47.

The base of transistor 23 is also directly connected to the collector of transistor 34 and it too will be at the effective output potential of op amp 21. Its emitter will be at $V_{BE}$ below this potential and the resulting current will flow in zener diode 48 whose construction matches that of zener diode 38. Thus, node 49 will be close to ground potential because the operating current of zener diode 48 is related to the current flowing in zener diode 38. Resistor 50, which is a low value isolation resistor, couples the potential at node 49 to the base of transistor 51. Resistor 52 returns the zener diode 48 to the emitter return of transistor 51 and thereby sets the conduction current of transistor 23 and zener diode 48 to approximately the VBE of transistor 51 divided by the value of resistor 52. Low value isolation resistor 53 couples the emitter of transistor 51 to output terminal 12. This means that output terminal 12 will be close to the sum of the $V_{BE}$s of transistors 23 and 51 and the zener voltage below the effective op amp output voltage. This action constitutes voltage 28 of FIG. 1.

The voltage at the collector of transistor 34 is at the potential of the voltage drop across resistor 24 plus the $V_{BE}$s of transistors 22 and 34, plus the drops across diodes 35 and 36 above ground. Since terminal 12 is at ground potential (nominally), the collector of transistor 34 will also be at the potential of the zener diode 48 drop plus the $V_{BE}$ of transistors 23 and 51 above ground. Thus, the voltage drop across resistor 24 is equal to the zener diode voltage less two $V_{BE}$s. This voltage drop is created as follows.

Assuming zero current in resistor 57 the voltage across zener diode 38 is applied to the base of transistor 56. The resultant current will flow in resistor 59 and diode 58. Its magnitude will be equal to the zener voltage less two diodes, the $V_{BE}$ of transistor 56 and the voltage drop across diode 58, divided by the value of resistor 59. This current will also flow in transistor 60 and resistor 63. Transistor 62 forms a current mirror with transistor 60. Transistor 61 forces transistor 60 to function as a diode and thereby creates an active current mirror. Thus, the current flowing in transistor 60 is replicated in transistor 62 and resistor 64. This current is applied to the base of transistor 30 and diode 33. This combination reflects the current into resistor 24. Therefore, the current flowing in resistor 24 is related to two diodes below the voltage across zener diode 38.

Since the output of op amp 21 is equal to the voltage drop across resistor 24 plus four diodes its value will be related to the zener diode voltage plus two diodes. When the drops across zener diode 48 and transistors 23 and 51 are subtracted from the output voltage it can be seen that terminal 12 is at zero volts. This means that the voltage drop across zener diode 48 plus the $V_{BE}$s of transistors 23 and 51 comprise element 28 of FIG. 1. Accordingly, as V28 varies with temperature the voltage across resistor 24 will vary and compensate so as to track it. This action temperature compensates the circuit.

Transistor 54 is cascode connected to transistor 51 and its base is connected to the effective output terminal of op amp 21. This cascode connection avoids any chance of the circuit exceeding the voltage breakdown potential of transistor 51, particularly during any negative swings of output terminal 12.

To ensure that the potential at terminal 12 is close to zero for quiescent conditions an adjustment is provided by way of terminal 54. While not shown, terminal 54 is normally connected to a potentiometer arm, the body of which is connected across terminals 13 and 14. Thus, terminal 54 can be varied between $+V_S$ and ground. Terminal 54 is connected via resistor 55 to the base of transistor 56 which is also coupled via resistor 57 to zener diode 38. It can be seen that when terminal 54 is at the zener diode potential there will be no current flow in resistors 55 and 57. The base of transistor 56 will also be at the zener potential. The voltage across resistor 59 will then be $2V_{BE}$ below the zener voltage and its value will determine the current flowing in transistor 56. This current will also flow in transistor 60 which is forced to operate as a diode by the action of emitter follower transistor 61. This circuit in combination with transistor 62, forms an active current mirror as described above. Resistors 63 and 64 assist in the control of the current mirror and are typically matched to produce unity current gain. The current mirror output from transistor 62 supplies current to the current mirror consisting of diode 33 and transistor 30 and hence via the collector of transistor 30 to feedback resistor 24. Therefore, varying the potential at terminal 54 will vary the current flowing in resistor 24. As this current increases the feedback will cause the effective output voltage of op amp 21 at the base of transistor 23 to be pulled up and hence the output voltage of op amp 21. This in turn will increase the voltage at output terminal 12. A decrease in the current in transistor 30 will have the opposite effect and will lower the voltage of terminal 12. Typically, the adjust terminal 54 is set so that the output voltage at terminal 12 is zero for a quiescent (unmodulated signal) condition.

EXAMPLE

The circuit of FIG. 2 was constructed using conventional monolithic silicon junction isolated parts. The NPN transistors were of high Beta vertical construction while the PNP transistors were of conventional lateral construction. The zener diodes were the emitter-base junctions of NPN transistors and had a zener voltage of about 6.0 volts. The following component values were employed.

| COMPONENT | VALUE |
|---|---|
| Resistor 17 | 2 k ohms |
| Resistor 24 | 6 k ohms |
| Capacitor 27 | 1 PF |
| Resistor 39 | 6.2 k ohms |
| Resistor 41 | 8.2 k ohms |
| Resistors 43 and 57 | 1 k ohms |
| Resistors 44 and 50 | 500 ohms |
| Capacitor 45 | 2 PF |
| Resistor 52 | 1.5 k ohms |
| Resistor 53 | 50 ohms |
| Resistor 55 | 9 k ohms |
| Resistor 59 | 5.9 k ohms |
| Resistors 63 and 64 | 2 k ohms |

A 12-volt power supply was connected between terminals 13 and 14 and a 5-volt supply was connected between terminals 15 and 16. The output terminal 12 produced a replica of the input carrier modulation and could swing between ±4-volts with a distortion of less than 5%. The circuit had a bandwidth of about 25 MHZ.

The invention has been described and a working example detailed. When a person skilled in the art reads the foregoing description, alternatives and equivalents, within the spirit and intent of the invention, will be apparent. Accordingly, it is intended that the scope of the invention be limited only by the following claims.

I claim:

1. An amplifier circuit having a pair of input terminals for accepting a differential input and an output terminal for producing a single-ended output referenced to ground potential, said amplifier circuit comprising:
   differential to single-ended converter means having a differential input coupled to said pair of input terminals and a single-ended output;
   an operational amplifier having a noninverting input coupled to a source of reference potential, an inverting input coupled to said single-ended output of said differential to single-ended converter means, and an output;
   a feedback resistor coupled between said operational amplifier output and inverting input, whereby said inverting input is forced to said reference potential; and
   level shift means coupled between said output of said operational amplifier and said circuit output terminal whereby said output terminal is at ground potential when said circuit is in a quiescent state.

2. The amplifier circuit of claim 1 wherein said operational amplifier is operated from power supply rails connectable to a first source of operating power and said circuit output terminal is returned to a power supply rail connectable to a second source of operating power.

3. The amplifier circuit of claim 1 wherein said operational amplifier output is operated at a potential equal to said level shift and acts, in combination with said feedback resistor, to produce a feedback current that is applied to said inverting input.

4. The amplifier circuit of claim 1 wherein said level shift means comprises a zener diode biased into reverse breakdown voltage.

5. The amplifier circuit, of claim 4 wherein the bias current flowing in said zener diode comprises a portion of the current flowing to said circuit output terminal.

6. The amplifier circuit of claim 5 wherein said circuit output terminal is coupled to the emitter of an emitter follower that is driven from said output of said operational amplifier.

7. The amplifier of claim 6 wherein said emitter follower further includes a cascode connected transistor coupled to its collector electrode.

* * * * *